United States Patent [19]

Jordan

[11] Patent Number: 5,198,785
[45] Date of Patent: Mar. 30, 1993

[54] DUAL EDGE PULSE WIDTH MODULATION SYSTEM

[75] Inventor: Edward P. Jordan, Greensboro, N.C.

[73] Assignee: Analog Devices, Inc., Norwood, Mass.

[21] Appl. No.: 890,949

[22] Filed: May 29, 1992

[51] Int. Cl.⁵ .............................................. H03K 7/08
[52] U.S. Cl. ...................................... 332/109; 375/22; 307/265
[58] Field of Search ..................... 332/109, 110, 111; 375/22; 328/58, 111, 112; 307/265, 266, 267

[56] References Cited

U.S. PATENT DOCUMENTS 4,891,828 1/1990 Kawazoe ..................... 307/265 X
5,045,800 9/1991 Kung .............................. 307/265 X
5,119,045 6/1992 Sato ..................................... 332/109

*Primary Examiner*—Siegfried H. Grimm
*Attorney, Agent, or Firm*—Iandiorio & Dingman

[57] ABSTRACT

A dual edge pulse width modulation system includes a ramp generator for generating a voltage ramp; an n bit digital to analog converter having a normal and an inverted output for establishing a leading edge and a trailing edge reference; a comparator responsive to the ramp and the leading edge and trailing edge references, respectively, for defining the leading edge and the trailing edge of a pulse; and a pulse generator for producing a pulse having the width determined by the defined leading and trailing edges.

24 Claims, 8 Drawing Sheets

DUAL EDGE PULSE WIDTH MODULATION SYSTEM

FIELD OF INVENTION

This invention relates to an improved dual edge pulse width modulation system.

BACKGROUND OF INVENTION

There are three types of pulse width modulation: leading edge modulation (LEM), trailing edge modulation (TEM), and dual edge modulation (DEM). Typically LEM can be produced with one ramp, two comparators and a reference voltage which fixes the trailing edge of the pulse. TEM is accomplished by a similar arrangement but the reference voltage is at the beginning of the ramp to fix the leading edge of the pulse. These circuits produce but one pulse during every other clock cycle. As the ramp recovers, half of the clock cycle is unusable. In high speed applications two such circuits are used to provide a ramp during each half clock cycle so a sequence of alternate pulses is provided. To generate DEM, two ramps and two reference voltages are used, and in high-speed applications, again, two such circuits are used to obtain a sequence of alternating pulses. In another approach a phase locked loop (PLL) is employed with a triangular (dual ramp) waveform to obtain center justified DEM. While this approach does eliminate some of the redundancy of the prior arrangements it introduces the extra expense and complexity associated with PLLs. In addition, PLLs do not lend themselves to easy transition between formats LEM, TEM, DEM. The output of the PLL at lock may not line up exactly with other formats and so an offset adjust must be added. These offset adjusts are not always well controlled and need to be compensated.

SUMMARY OF INVENTION

It is therefore an object of this invention to provide an improved dual edge pulse width modulation system.

It is a further object of this invention to provide such a dual edge pulse width modulation system which requires but one ramp to generate LEM, TEM and DEC.

It is a further object of this invention to provide such a dual edge pulse width modulation system which uses but a single digital to analog converter (DAC).

It is a further object of this invention to provide such a dual edge pulse width modulation system which can utilize the full n bit capability of the DAC in generating DEM.

It is a further object of this invention to provide such a dual edge pulse width modulation system which can utilize the full n bit capability in the DEM mode and in the LEM and TEM modes too.

It is a further object of this invention to provide such a dual edge pulse width modulation system which can utilize but two ramps for high-speed sequential alternate generation of DEM.

It is a further object of this invention to provide such a dual edge pulse width modulation system which uses but two DACs to generate high-speed sequential alternate DEM mode and in the LEM and TEM modes too.

The invention results from the realization that a simple, fast, accurate, highly reliable dual edge pulse width modulation system for DEM can be achieved using a single ramp and a DAC having a normal and inverted output and that the full n bit capability of the DAC can be utilized without center crossover ambiguity by providing the operating current roughly half to the DAC and half to one of the normal and inverted outputs, and from the further realization that by switching all the operating current to the DAC its full n bit capacity can also be utilized in LEM and TEM.

This invention features a dual edge pulse width modulation system including a ramp generator for generating a voltage ramp and n bit digital to analog converter having a normal and an inverted output for establishing a leading edge and a trailing edge reference. There are comparator means responsive to a ramp and to the leading edge and trailing edge references, respectively, for defining the leading edge and the trailing edge of a pulse. Pulse generating means produce a pulse having the width determined by the defined leading and trailing edge.

There may be control means for providing an operating current to the digital to analog converter to establish one of the leading and trailing edge references on one of the normal and inverted outputs and providing a bias current approximately equal to the operating current to establish the other of the leading and trailing edge references on the other of the normal and inverted outputs for enabling production of a pulse up to the full n bit width definable by the digital to analog converter without crossover of the leading and trailing edge references. Each of the currents may be capable of establishing a voltage level at the outputs equivalent to approximately one half of the full n bit capacity of the digital to analog converter. One of the bias and operating currents may actually be slightly greater than the other to prevent coincidence of the leading and trailing edge references. The control means may include an operating current source and a bias current source. The control means may further include switching means for connecting the bias current source in parallel with the operating current source for enabling provision of a total current up to the full n bit capacity of the digital to analog converter.

The invention also contemplates a ramp generator which generates a plurality of sequential voltage ramps. There are a corresponding plurality of n bit digital to analog converters each having a normal and inverted output and being responsive to a pulse width request for establishing a plurality of leading edge and trailing edge references. Pulse generating means produces a plurality of sequential pulses having the requested width determined by the defined leading and trailing edges. For example, two sets of leading and trailing edge references and two digital to analog converters may be used to generate two sets of alternating, sequential pulses, often referred to as odd and even.

DISCLOSURE OF PREFERRED EMBODIMENT

Other objects, features and advantages will occur to those skilled in the art from the following description of a preferred embodiment and the accompanying drawings, in which.

This invention may be accomplished with a dual edge pulse width modulation system that includes a ramp generator for generating a voltage ramp, and an n bit digital to analog converter that has a normal and an inverted output. The digital to analog converter (DAC) is responsive to a pulse width request for establishing a leading edge and a trailing edge reference. There are comparator means responsive to the ramp and to the leading edge and the trailing edge references, respectively, for defining the leading edge and the trailing edge of a pulse. Both generating means produce a pulse having the requested width determined by the defined leading and trailing edges.

In applications where one or both of leading edge modulation (LEM) and trailing edge modulation (TEM) are desirable in addition to DEM, a control circuit is used which provides the full current through the DAC for DEM and for LEM and TEM mode pulses, and splits the current between the DAC and one of the normal and inverted outputs of the DAC, in order to utilize the full DAC capacity when in the DEM mode as well.

Figure 1:
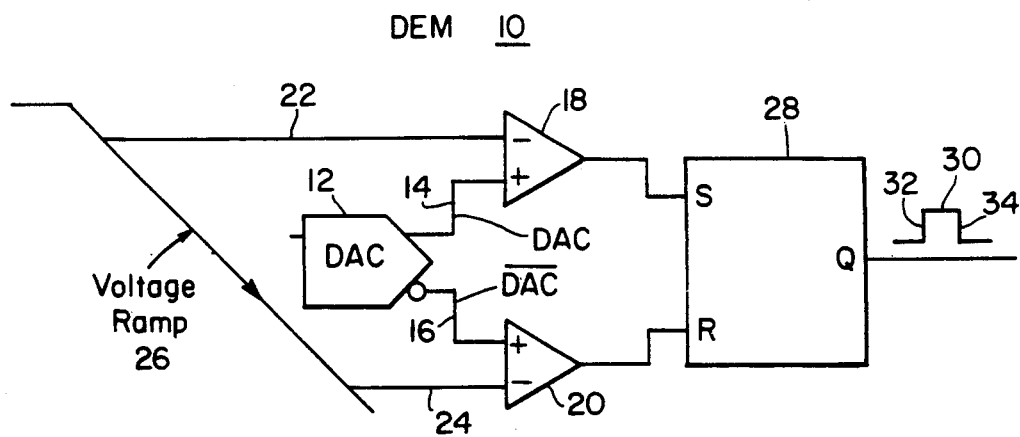
FIG. 1 is a schematic diagram of a simple implementation of a dual edge modulation pulse width generator circuit according to this invention.

There is shown in FIG. 1 a pulse width modulation system 10 according to this invention which includes digital to analog converter 12 having a normal output, DAC 14, and an inverted output, $\overline{DAC}$ 16, which provide the positive inputs to comparators 18 and 20. The negative input 22 to comparator 18 and the negative input 24 to comparator 20 are derived directly from the voltage ramp 26. Thus a pulse begins when ramp 26 descends through the reference voltage from output, DAC 14, and ends when ramp 26 descends through an inverted output, $\overline{DAC}$ 16, causing flip-flop 28 to generate pulse 30. Comparator 18 sets flip-flop 28, establishing leading edge 32 and comparator 20 resets flip-flop 28, defining trailing edge 34.

Figure 2:
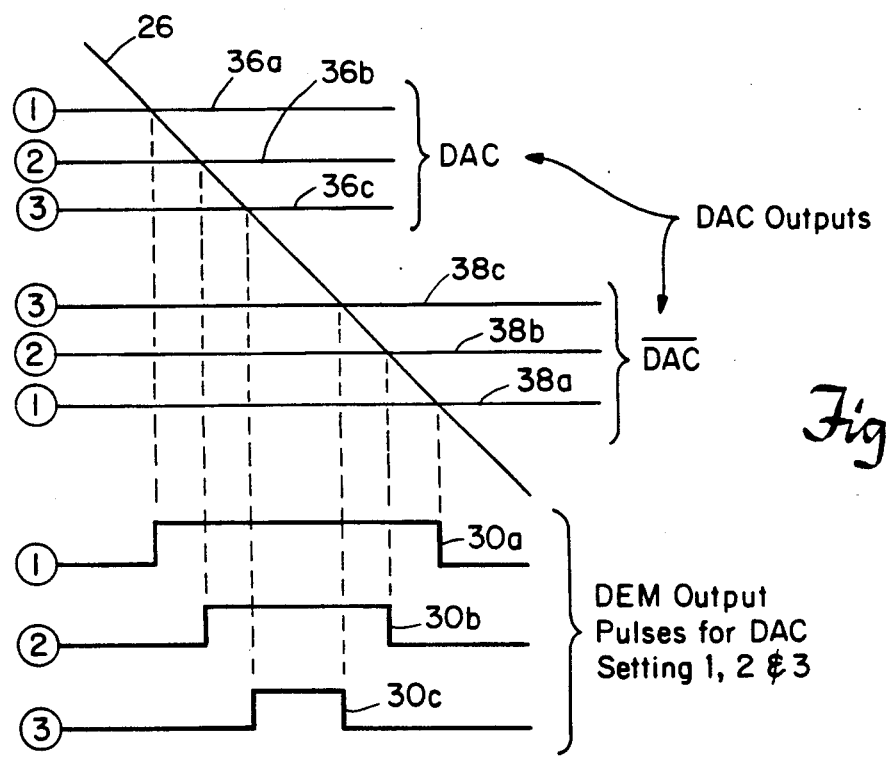
FIG. 2 is an illustration of the waveforms generatable by the system of FIG. 1.
Figure 3:
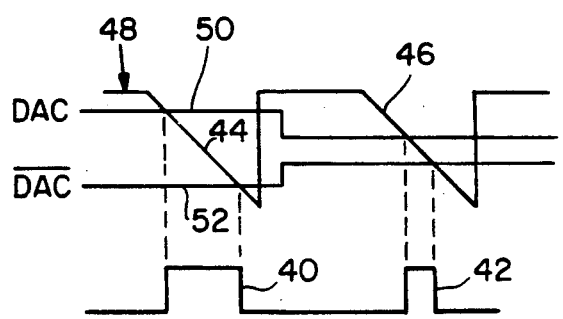
FIG. 3 is a more detailed illustration of the waveforms depicting the dual edge modulation and the resulting pulses.

Pulses of various sizes 30a, 30b, 30c, FIG. 2, are generated in this way by DAC outputs 36a, 36b, 36c, and $\overline{DAC}$ outputs 38a, 38b and 38c, FIG. 2, where they intersect ramp 26. A typical series of pulses 40, 42, FIG. 3, generated from two sequential ramps 44, 46 of a single ramp signal 48, vary in width as dictated by the change in the DAC and $\overline{DAC}$ signals 50, 52.

Figure 4:
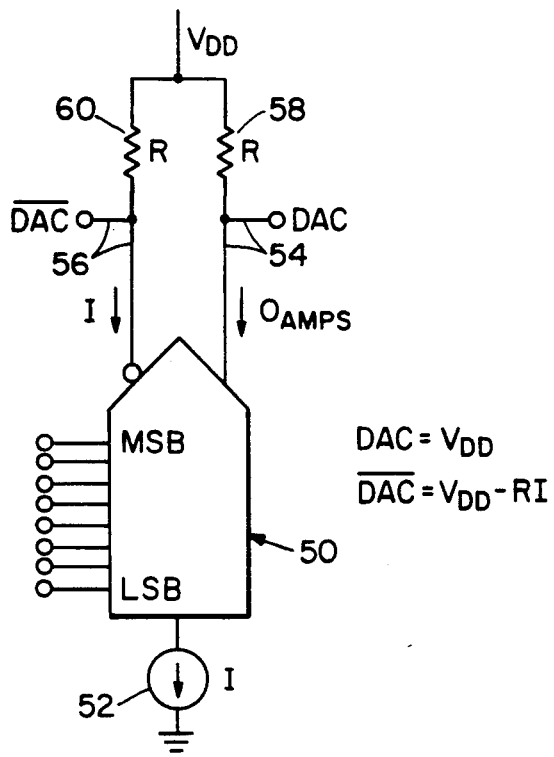
FIG. 4 is a schematic diagram showing the operation of a digital to analog converter in accordance with this invention.

Typically, the digital to analog converter 50, FIG. 4, is connected to a current source 52 that provides a current I through digital to analog converter 50 which switches between its normal output 54 and inverted output 56 which are connected through equal resistors 58 and 60 to voltage source $V_{DD}$. Converter 50 has an n bit capacity, for example, 8 bit. When all of those bits are zero, as shown in FIG. 4, full current flows through $\overline{DAC}$ 56 and zero current flows through DAC 54. Thus the voltage at DAC is $V_{DD}$ and the voltage at $\overline{DAC}$ is $V_{DD}-RI$, where R is the ohmic value of the resistors 58 and 60.

Figure 5A:
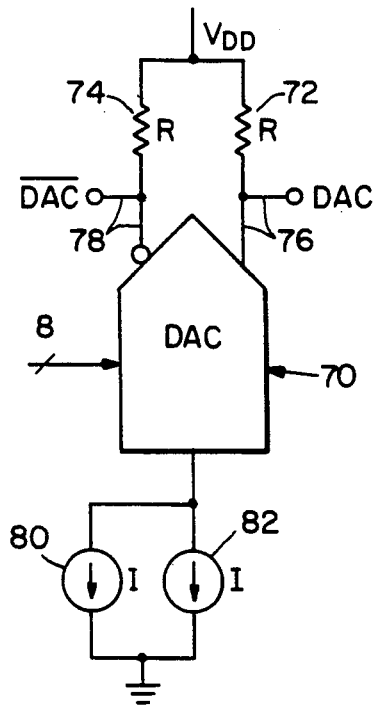
FIG. 5A is a schematic diagram similar to FIG. 4 utilizing two current sources.
Figure 5B:
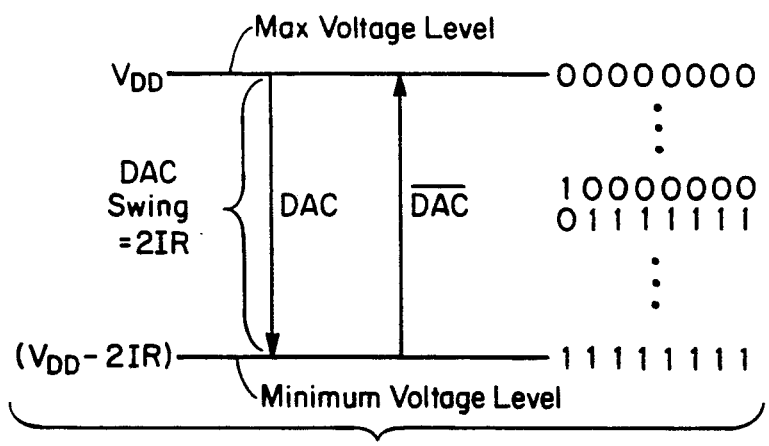
FIG. 5B is a graphic illustration of the crossover problem that occurs in the operation of FIG. 5A.

The crossover problem can be understood with reference to digital to analog converter 70, FIG. 5A, which is an 8 bit converter similar to converter 50 in FIG. 4. There is the same voltage supply $V_{DD}$, the same equal resistors 72, 74, and the same outputs DAC 76 and $\overline{DAC}$ 78. However, converter 70 in FIG. 5A is provided with twice the amount of current, 2I, through the use of two current sources 80 and 82. This is done to illustrate the crossover problem and the solution to that problem provided by this invention. When converter 70 is loaded with all zeroes, as indicated in FIG. 5B, the DAC output 76 is at the maximum voltage level $V_{DD}$ and the $\overline{DAC}$ output 78 is at the minimum voltage level $V_{DD}-2IR$. As the count in converter 70 progresses from all zeroes to all ones, the DAC output 76 moves downward from $V_{DD}$ to the minimum voltage level, $V_{DD}-2IR$, while the $\overline{DAC}$ output 78 moves toward the maximum voltage level $V_{DD}$. Thus as can be seen, at the midpoint, when the count in the converter transitions in either direction between 10000000 and 01111111, the two voltages will be coincident. From that point on the system output is ambiguous since the flip-flop can be reset before it is set and there will be no pulse. One solution to this problem is to run the n bit converter to only the n−1 bit level. In FIG. 5A, eight bit converter 70 would only function up through seven bits. This of course sacrifices half the capacity of the digital to analog converter.

Figure 6A:
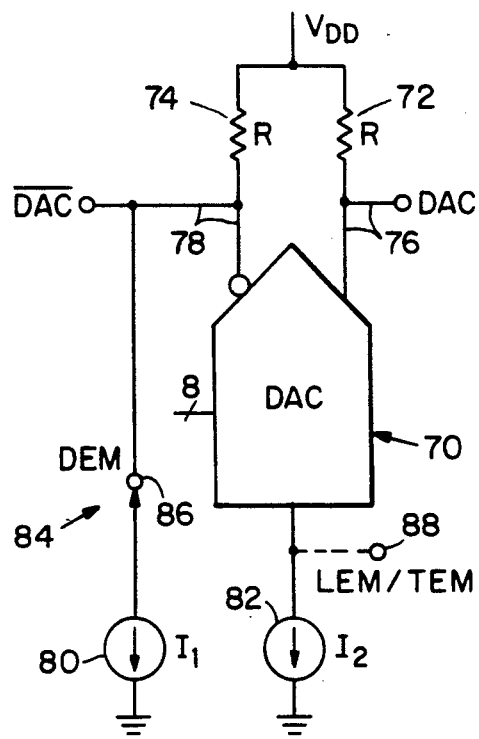
FIG. 6A is a schematic diagram similar to FIG. 5A but employing a circuit according to this invention.
Figure 6B:
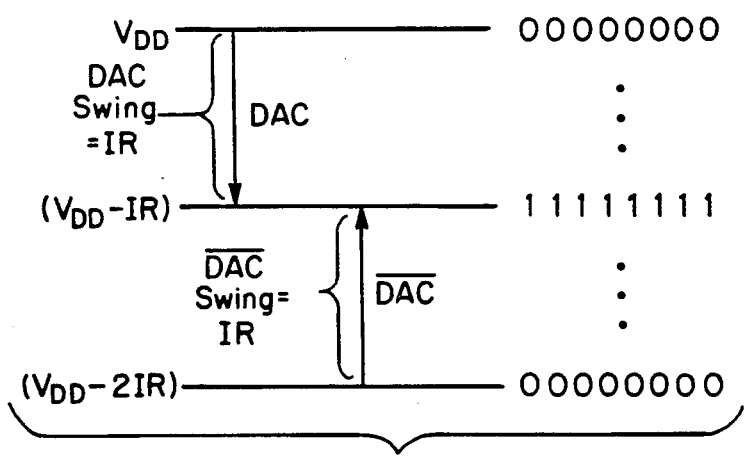
FIG. 6B is a graphic illustration of the voltage swings in FIG. 6A illustrating the prevention of the crossover problem.

This is overcome by separating the second current source 80, FIG. 6A, so that it is connected directly to $\overline{DAC}$ output 78 of converter 70. Then the DAC output 76 swings from $V_{DD}$ to $V_{DD}-IR$ as the input moves from all zeroes to all ones as indicated in FIG. 6B, whereas the $\overline{DAC}$ output 78 moves from $V_{DD}-2IR$ to $V_{DD}-IR$ as the count in the converter moves from all zeroes to all ones. In this way there is no crossover and no ambiguity with respect to setting and resetting of the flip-flop which generates the output pulse, and the full n bit capacity of the converter is utilized. To further ensure separation, the two currents can be made to differ slightly so that the main operating current $I_2$ from current source 82 is slightly less than the biasing current $I_1$ provided by current source 80. One drawback to this configuration is that if one of the other modes LEM or TEM is being generated through converter 70, only half of the capacity of the converter is available. This can be overcome by simply using a switching device 84 which during the DEM mode, connects source 80 directly to $\overline{DAC}$ output 78, at at terminal 86, but in the LEM or TEM mode connects source 80 to terminal 88 paralleling source 80 with source 82.

Figure 7:
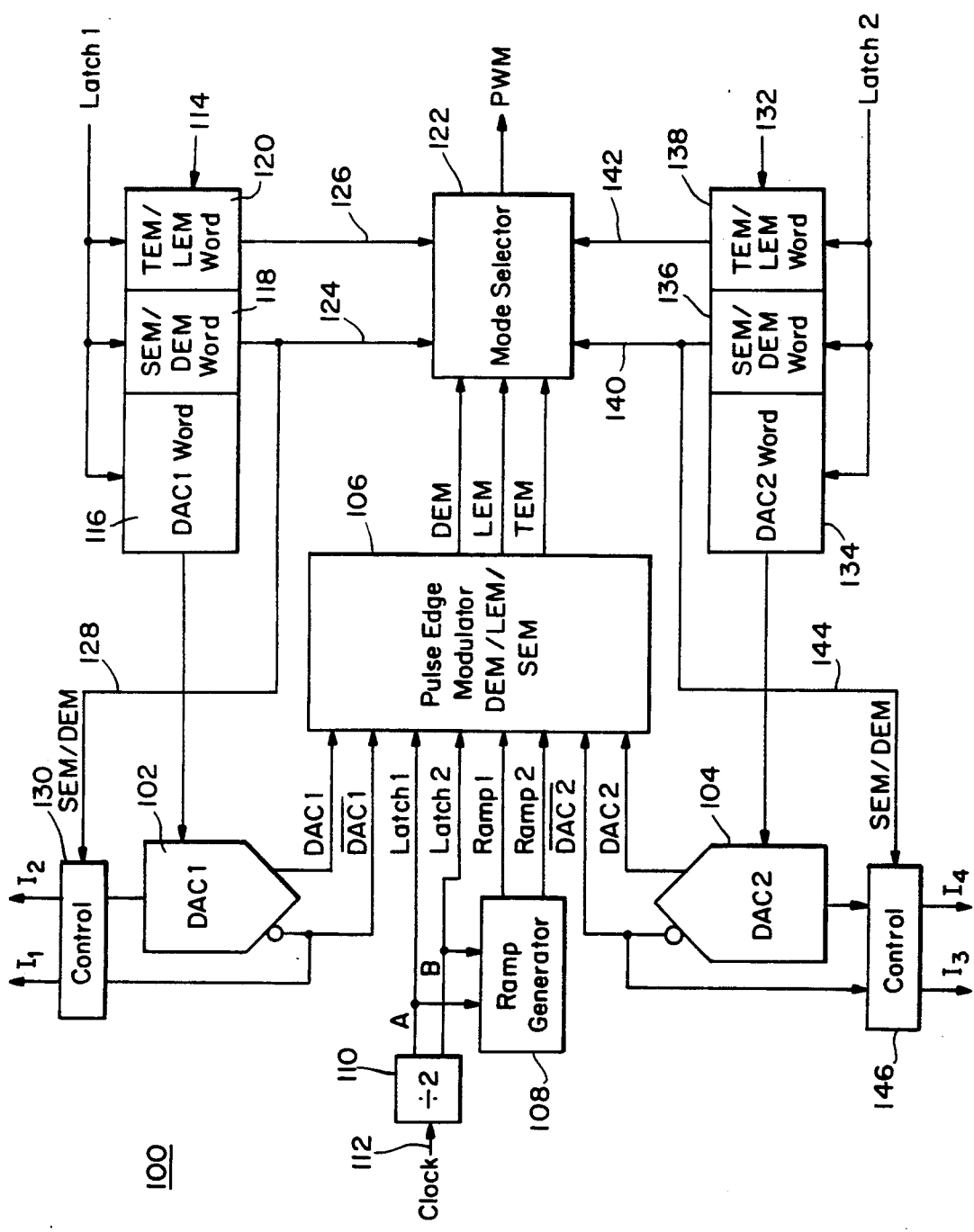
FIG. 7 is a block diagram of a high-speed pulse width modulation system using duplicate ramp digital to analog converters and control circuits to provide odd and even pulses during both halves of each clock cycle.

In a high-speed pulse width modulation system 100, FIG. 7, two such converters 102 and 104 can be used in conjunction with a pulse edge modulator 106 which is capable of generating any one of the three modes DEM, LEM or TEM, so that all the pulses denominated odd and even can be generated sequentially during each half of the clock signal output of divide by two circuit 110.

Pulse edge modulator 106 receives the $\overline{\text{DAC1}}$ and DAC1 outputs from digital to analog converter 102, the DAC2 and $\overline{\text{DAC2}}$ outputs from digital to analog converter 104; and the two ramps, ramp 1 and ramp 2, from ramp generator 108 driven by divide by two circuit 110, which is enabled by the incoming clock signal on line 112. Pulse edge modulator 106 also receives latch 1 and latch 2 signals from the divide by two circuit 110. Latch 1 is loaded during the time ramp 2 is active and latch 2 is loaded during the time ramp 1 is active. Latch circuit or register 114 is enabled by latch 1 to receive n bit DAC word 116. The n bit DAC word 116 causes converter 102 to establish the levels of DAC1 and $\overline{\text{DAC1}}$. Latch 1 also causes to be loaded in register 114 the SEM/DEM word 118, which indicates whether a single-edge modulation (SEM) or dual edge modulation (DEM) is requested for the next pulse. At the same time, latch 1 causes the TEM/LEM word 120 to be loaded in register 114 to indicate which of the single edge modulation modes is selected if a single edge modulation has been requested by the SEM/DEM word 118. Thus while pulse edge modulator 106 is generating all three modes of modulation, DEM, LEM and TEM, only one will be selected by mode selector 122 in response to the SEM/DEM word input on line 124 and the TEM/LEM word input on line 126. The SEM/DEM word 118 is also provided over line 128 for single edge modulation, then control 130 directs both currents $I_1$ and $I_2$ through converter 102. If SEM/DEM word 118 indicates dual edge modulation, then only the operating current $I_2$ is established through DAC1 and the bias current $I_1$ is drawn through $\overline{\text{DAC1}}$. Converter 104 is similarly served by register 132 which contains DAC2 word 134, SEM/DEM word 136 and TEM/LEM word 138, all responsive to the latch 2 signal. SEM/DEM word 136 and TEM/LEM word 138 provide indications on lines 140 and 142 to mode selector 122 in the same manner as associated with register 114. Mode selector 122 under direction from registers 114, 132 selects the mode DEM, TEM, LEM to be outputted and may be considered as including registers 114 and 132. SEM/DEM word 136 provides an indication on line 144 to control circuit 146 which controls the operating current $I_4$ and biasing current $I_3$ for converter 104 in the same way as control 130 does with respect to converter 102. Pulse edge generator 106 may be considered as including DACs 102, 104, registers 114, 132, and controls 130, 146.

Figure 8:
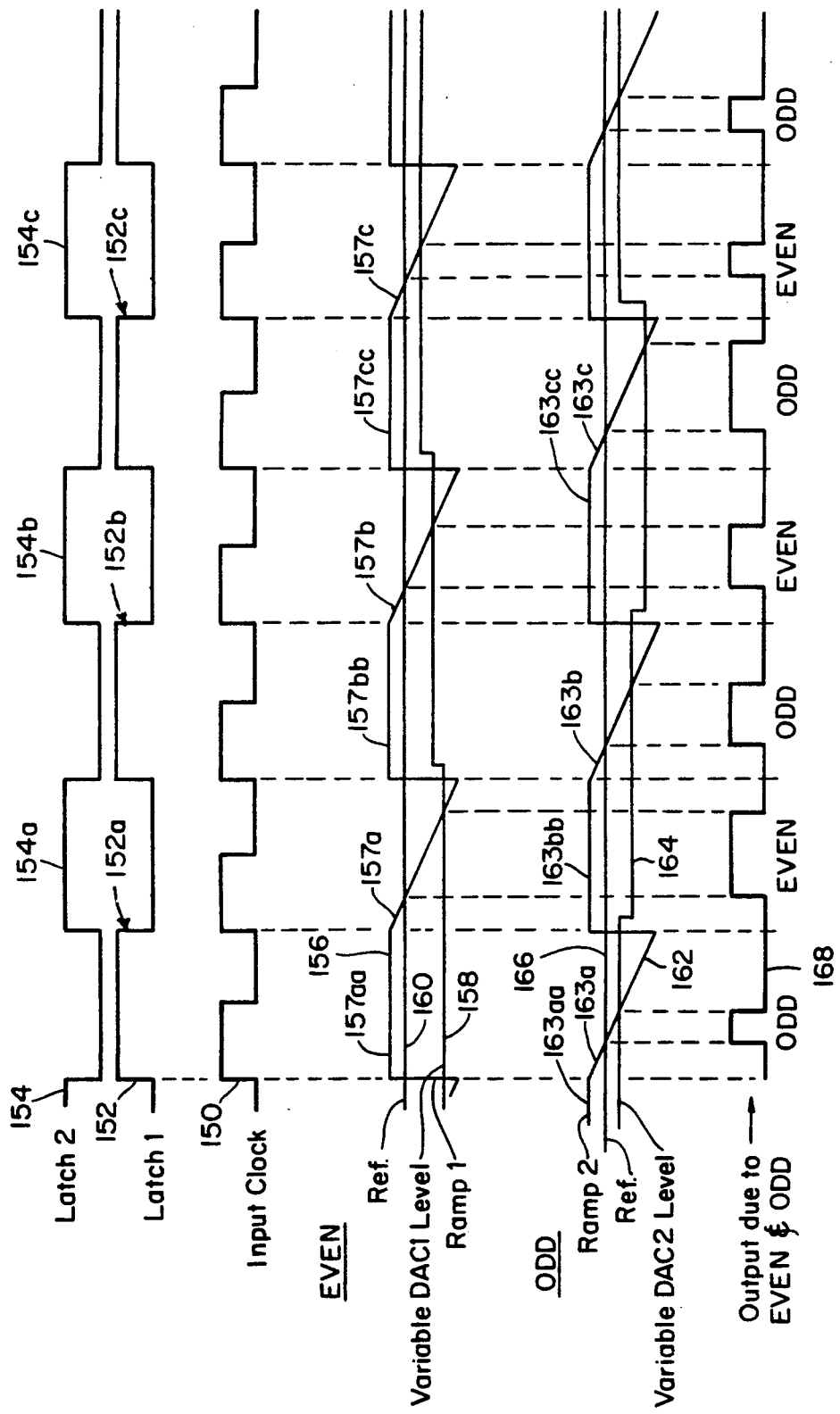
FIG. 8 is an illustration of the waveforms generated in the circuit of FIG. 7 when using two ramps at A and B to generate odd and even pulses during both halves of the divide by two clock cycle.

The various signals occurring in FIG. 7 are shown in FIG. 8. The input clock 150 which appears on line 112 is used to generate latch 1 signal 152 and latch 2 signal 154 during alternate halves of the divide by two clock output. For a simple generation of trailing edge modulated pulses, the even pulses are generated by ramp 1 156 in conjunction with the variable DAC1 level 158 and a fixed reference level 160 which may be supplied externally or generated internally of pulse edge modulator 106. Ramp 1 156 includes ramp portions 157a, b, c and rest portions 157aa, bb, cc. The odd pulses are generated using ramp 2 162 in conjunction with the variable DAC2 level 164 and reference 166. Ramp 2 162 includes ramp portions 163a, b, c and rest portions 163aa, bb, cc. The resulting series of pulse width modulated pulses is indicated at the series of waveforms labelled 168. Latch data is captured in latch 2 while ramp 1 is running. The signal latch 2 starts ramp 1 and loads latch 2. Latch 1 starts ramp 2 and loads latch 1.

Figure 9A:
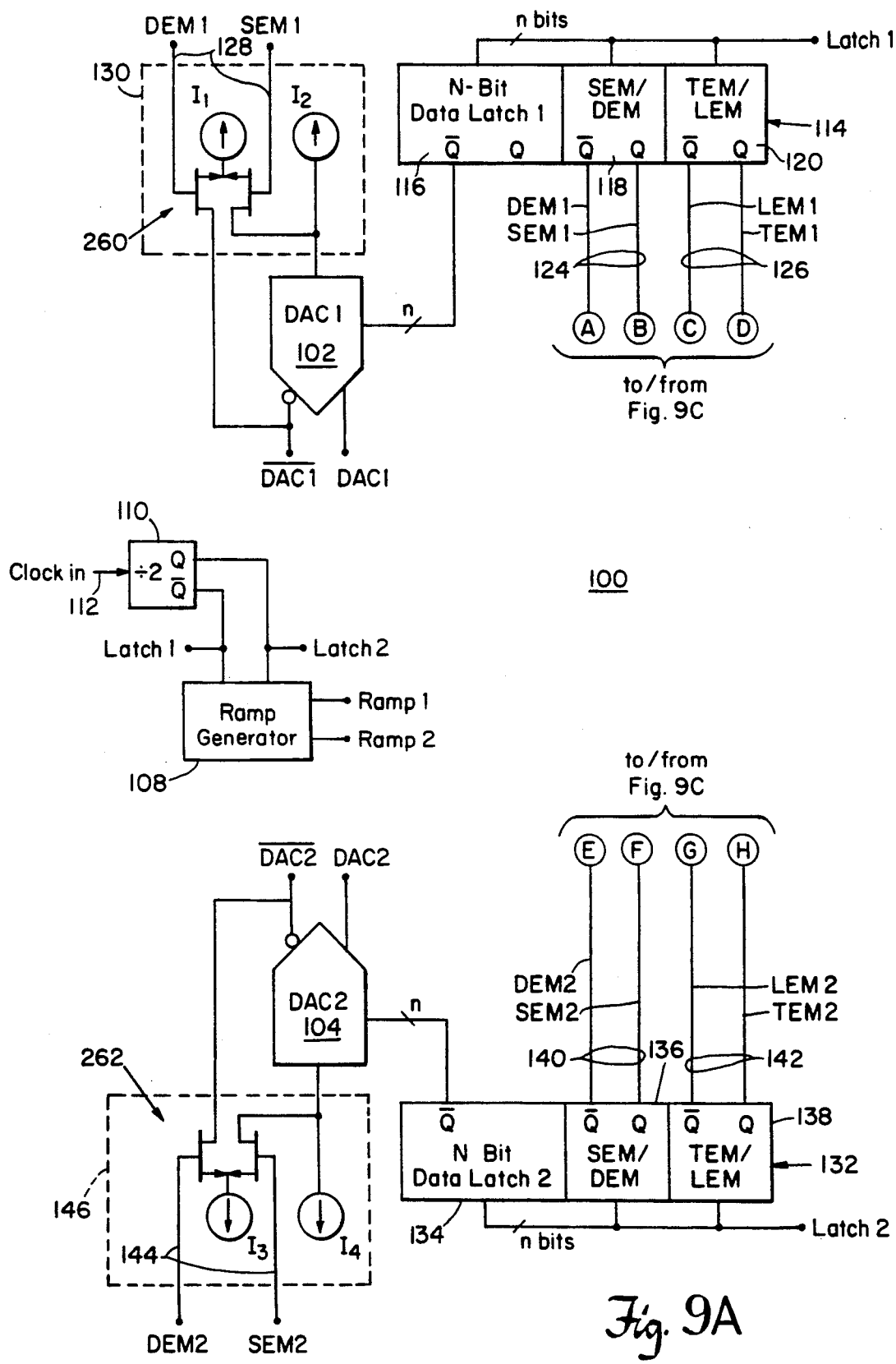
FIGS. 9A, B and C taken together are a more detailed diagram of the system of FIG. 8.
Figure 9B:
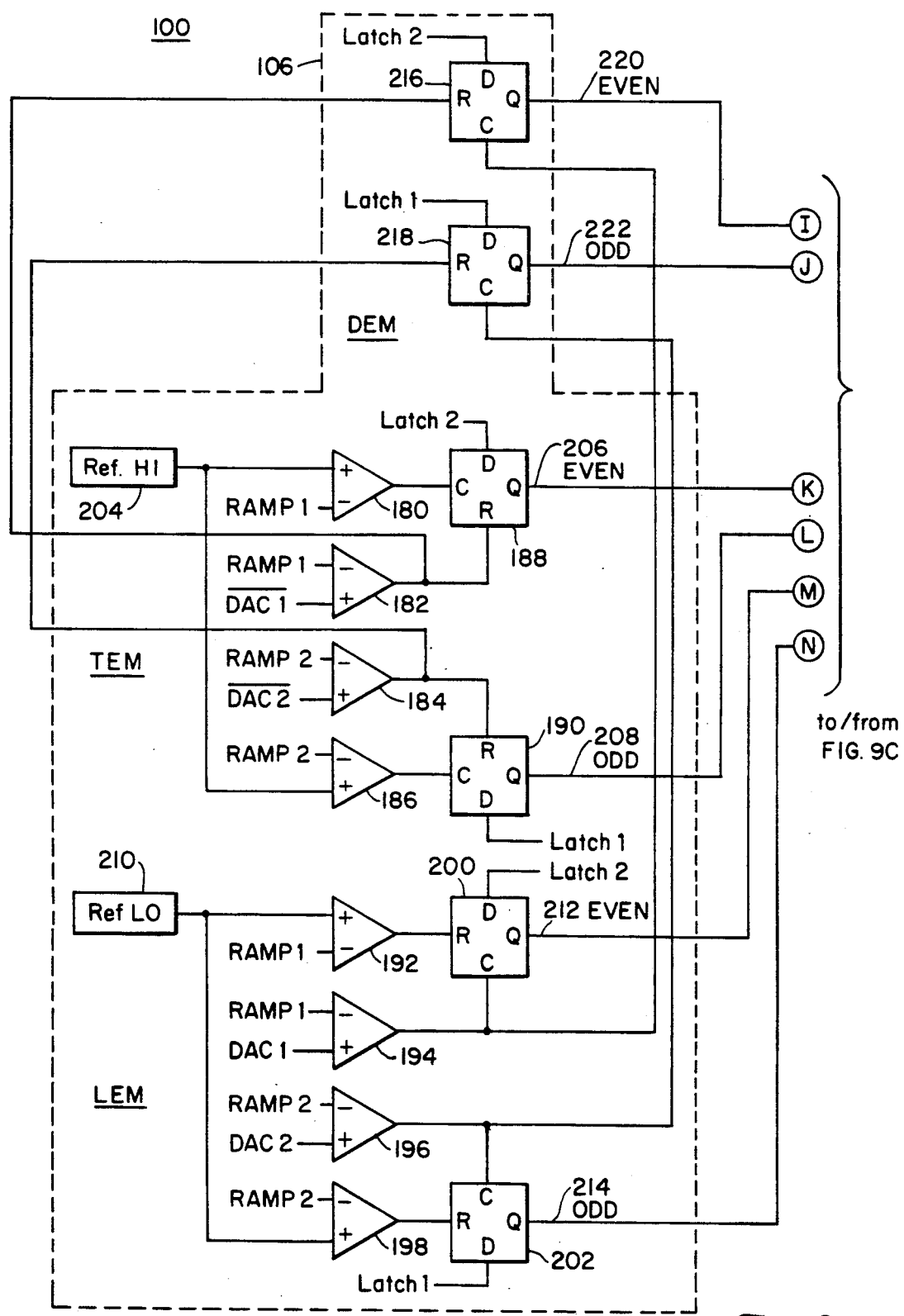
Figure 9C:
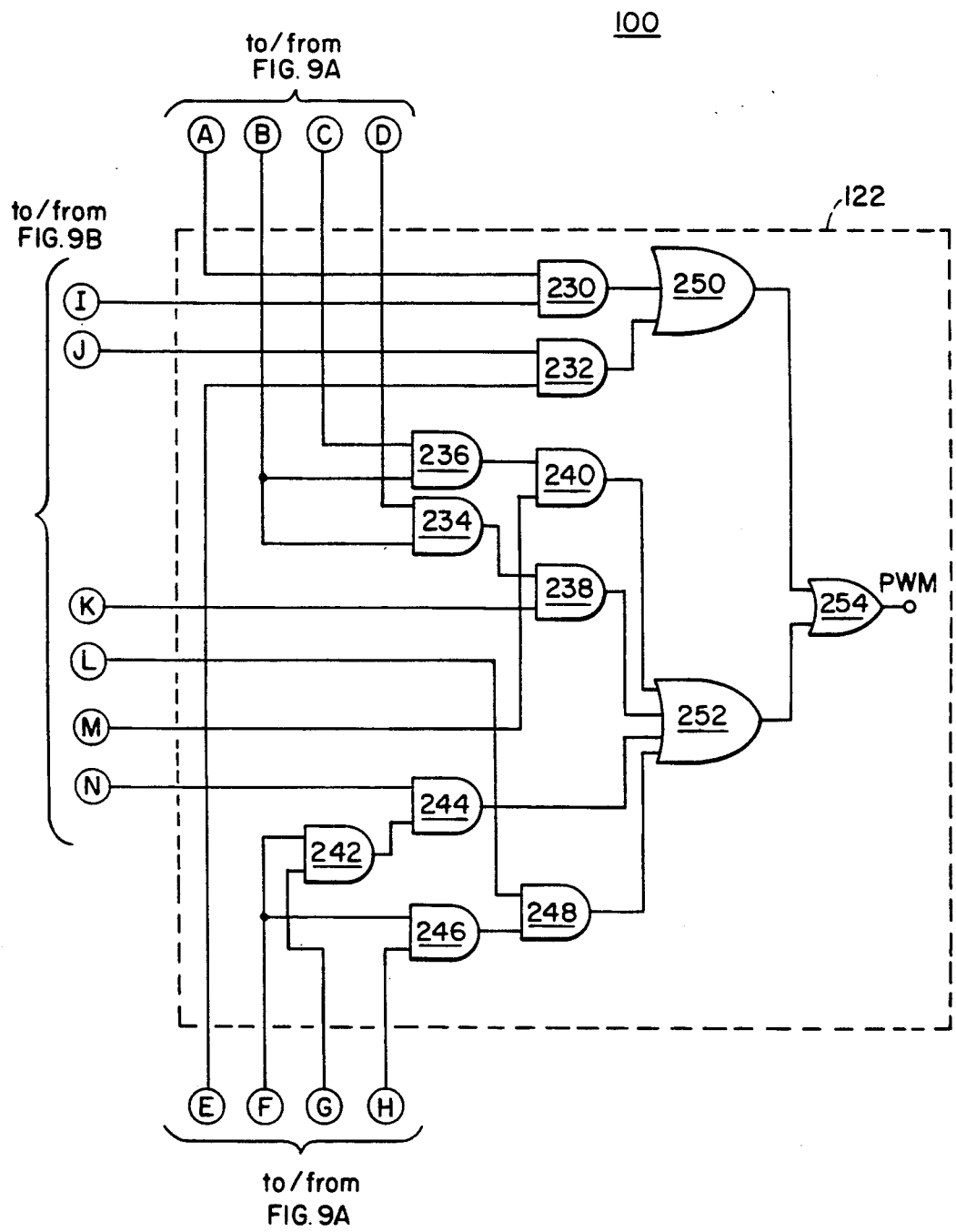

The pulse edge modulator 106 and mode selector 122 of system 100 are shown in greater detail in FIGS. 9A, B and C taken together. Pulse edge modulator 106 includes two sets of four comparators. The upper set of comparators 180, 182, 184 and 186 are used in conjunction with flip-flops or latches 188 and 190 to generate trailing edge modulation (TEM). The lower four comparators 192, 194, 196 and 198 are used in conjunction with latches or flip-flops 200 and 202 to generate leading edge modulation (LEM). Comparator 180 compares the reference input from high reference circuit 204 and ramp 1 to set flip-flop 188 at its input C to establish the fixed leading edge of a TEM pulse. Flip-flop 188 is reset at its input R to define the variable trailing edge of the TEM pulse by the output from comparator 182 which responds to ramp and to the $\overline{\text{DAC1}}$ input. The Q output of flip-flop 188 on line 206 thus produces the even pulse in the odd-even set. Flip-flop 188 is enabled to produce such a a pulse only during the latch 2 period when the latch 2 signal is present at the D input. The odd pulse for the DEM is produced by flip-flop 190 on line 208 during the latch 1 period when the latch 1 signal is present at the D input to flip-flop 190 and flip-flop 190 is set by comparator 186 which responds to the high reference from reference circuit 204 and ramp 2. Flip-flop 190 is reset by comparator 184 which responds to the ramp 2 and the $\overline{\text{DAC2}}$ signal.

Comparator 194 responds to the ramp 1 and DAC1 signals to set flip-flop 200 and define the variable leading edge of the even pulse while comparator 192 responds to the low reference level from low reference circuit 210 and ramp 1 to reset flip-flop 200 and thereby define the even LEM pulse on line 212. Comparator 196 responds to ramp 2 and DAC 2 to set flip-flop 202 defining the variable leading edge of the pulse produced by flip-flop 202 on line 214. This odd pulse on line 214 occurs during the period while flip-flop 202 is enabled.

For dual edge modulation, even latch 216 and odd latch 218 are used. Even latch 216 is set by the output from comparator 194 and reset by the output from comparator 182 to define the variable positions of the leading and the trailing edge of the even pulse provided on line 220. Latch 218 is set by the output of comparator 196 and reset by the output of comparator 184 to define the variable leading and trailing edges of the DEM odd pulse on line 222. In this way, only two ramps are used to constantly generate all three modes of modulation which can be selected in any mix of modes: that is, LEM, TEM and DEM can be selected in any order for even and/or odd pulses, and since they are always present, no synchronization problems occur when one of them is selected by mode selector 122.

Mode selector 122 includes two AND gates 230 and 232 associated with DEM latches 216, 218, four AND gates 234, 38, 246 and 248 associated with TEM latches 188 and 190, and four AND gates 242, 244, 236 and 240 associated with LEM latches 200 and 202. These AND gates feed two OR gates 250 and 252 which feed the final OR gate 254. AND gate 230 is enabled to pass the even pulse on line 220 when the $\overline{Q}$ output is high from word 11B in register 114, indicating that dual edge modulation and not single edge modulation has been chosen. Similarly, AND gate 232 is enabled to pass the odd pulse on line 222 when the $\overline{Q}$ pulse is high in word 136 of register 132. If either one of these AND gates is enabled, then their respective odd or even pulse will be passed to OR gate 250 and on to output OR gate 254.

If in contrast the Q output of SEM/DEM word 118 in register 114 is enabled, then one output is provided to each of AND gates 234 and 236. One of these two AND gates is then enabled depending upon whether the $\overline{Q}$ LEM1, or Q TEM1 outputs of word 120 are high in register 114. If AND gate 236 is enabled, it in turn enables AND gate 240 to pass the even pulse on line 212. If instead AND gate 234 is enabled, then it enables AND gate 238 to pass the even pulse on line 206. In either case, one of those pulses reaches OR gate 252 and is passed to the final output OR gate 254.

In a similar manner, the Q outputs from word 136 in register 132 provide one output to each of AND gates 242 and 246 depending upon whether the $\overline{Q}$ LEM2 output or the Q TEM2 output is high. One of those two gates 242 or 246 will have an output. If 242 has an output it enables AND gate 244 to pass the odd pulse on line 214. If AND gate 246 has an output it enables AND gate 248 to pass the odd pulse on line 208. In either case one of the signals is presented at OR gate 252 from where it is delivered to output OR gate 254.

The switching function of control 130 may be implemented using a differential switch 260. A SEM1 signal causes $I_1$ to be paralleled with $I_2$. A DEM1 output causes $I_1$ to be established with the $\overline{DAC1}$ output of converter 102. In a similar manner, differential circuit 262 in control 146 associated with converter 104 operates to control the path of current $I_3$.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A dual edge pulse width modulation system comprising:
   a ramp generator for generating a voltage ramp;
   an n bit digital to analog converter having a normal and an inverted output for establishing a leading edge and a trailing edge reference;
   comparator means, responsive to said ramp and to said leading edge and trailing edge references, respectively, for defining the leading edge and the trailing edge of a pulse; and
   pulse generating means for producing a pulse having the width determined by the defined leading and trailing edge.

2. The dual edge pulse width modulation system of claim 1 further including control means for providing an operating current through said digital to analog converter to establish one of said leading and trailing edge references on one of said normal and inverted outputs and providing a bias current approximately equal to said operating current to establish the other of said leading and trailing edge references on the other of said normal and inverted outputs for enabling production of a pulse up to the full n bit width definable by said digital to analog converter without crossover of said leading edge and trailing edge references.

3. The dual edge pulse width modulation system of claim 2 in which each of said currents is capable of establishing a voltage level at said outputs equivalent to approximately one half of the full n-bit capacity of said digital to analog converter.

4. The dual edge pulse width modulation system of claim 2 in which said bias current is slightly greater than said operating current to prevent coincidence of said leading and trailing edge references.

5. The dual edge pulse width modulation system of claim 2 in which said control means includes an operating current source and a bias current source.

6. The dual edge pulse width modulation system of claim 5 in which said control means further includes switching means for connecting said bias current source in parallel with said operating current source for enabling provision of a total current up to the full n-bit capacity of said digital to analog converter.

7. A dual edge pulse width modulation system comprising:
   a ramp generator for generating a plurality of sequential voltage ramps;
   a corresponding plurality of n-bit digital to analog converters each having a normal and an inverted output for establishing a plurality of leading edge and trailing edge references;
   comparator means, responsive to said ramps and to said leading edge and trailing edge references, respectively, for defining the leading edge and the trailing edge of a plurality of pulses; and
   pulse generating means for producing a plurality of sequential pulses having the requested width determined by the defined leading and trailing edges.

8. The dual edge pulse width modulation system of claim 7 further including control means for providing an operating current through each said digital to analog converter to establish one of said leading and trailing edge references on one of said normal and inverted outputs and a bias current approximately equal to said operating current to establish the other of said leading and trailing edge references on the other of said normal and inverted outputs for enabling production of a pulse up to the full n bit width definable by the associated said digital to analog converter without crossover of said leading edge and trailing edge references.

9. The dual edge pulse width modulation system of claim 8 in which there are two ramps, two sets of leading and trailing edge references, two digital to analog converters, and there are generated alternating sequential pulses.

10. The dual edge pulse width modulation system of claim 8 in which each of said currents associated with each of said digital to analog converters is capable of establishing a voltage level at said outputs equivalent to approximately one half of the full n-bit capacity of said digital to analog converter.

11. The dual edge pulse width modulation system of claim 8 in which said bias current is slightly greater than said operating current to prevent coincidence of said leading and trailing edge references.

12. The dual edge pulse width modulation system of claim 8 in which said control means includes an operating current source and a bias current source associated with each said digital to analog converter.

13. The dual edge pulse width modulation system of claim 12 in which said control means further includes switching means associated with each said digital to analog converter for connecting said bias current source in parallel with said operating current source for enabling provision of a total current up to the full n-bit capacity of said digital to analog converter.

14. A dual edge pulse width modulation system comprising:
   a ramp generator for generating a voltage ramp;

an n bit digital to analog converter having a normal and an inverted output for establishing a leading edge and a trailing edge reference;

comparator means, responsive to a said ramp and to said leading edge and trailing edge references, respectively, for defining the leading edge and the trailing edge of a pulse;

pulse generating means for producing a pulse having the width determined by the defined leading and trailing edge;

control means for providing an operating current through said digital to analog converter to establish one of said leading and trailing edge references on one of said normal and inverted outputs and providing a bias current approximately equal to said operating current to establish the other of said leading and trailing edge references on the other of said normal and inverted outputs for enabling production of a pulse up to the full n bit width definable by said digital to analog converter without crossover of said leading and trailing edge references.

15. The dual edge pulse width modulation system of claim 14 in which each of said currents is capable of establishing a voltage level at said outputs equivalent to approximately one half of the full n-bit capacity of said digital to analog converter.

16. The dual edge pulse width modulation system of claim 14 in which said bias current is slightly greater than said operating current to prevent coincidence of said leading and trailing edge references.

17. The dual edge pulse width modulation system of claim 14 in which said control means includes an operating current source and a bias current source.

18. The dual edge pulse width modulation system of claim 17 in which said control means further includes switching means for connecting said bias current source in parallel with said operating current source for enabling provision of a total current up to the full n-bit capacity of said digital to analog converter.

19. A dual edge pulse width modulation system comprising:

a ramp generator for generating a plurality of sequential voltage ramps;

a corresponding plurality of n bit digital to analog converters, each having a normal and an inverted output, for establishing a plurality of leading edge and trailing edge references;

comparator means, responsive to a said ramp and to said leading edge and trailing edge references, respectively, for defining the leading edge and the trailing edge of a plurality of pulses;

pulse generating means for producing a plurality of sequential pulses having the width determined by the defined leading and trailing edges;

control means for providing an operating current through each said digital to analog converter to establish one of said leading and trailing edge references on one of said normal and inverted outputs and providing a bias current approximately equal to said operating current to establish the other of said leading and trailing edge references on the other of said normal and inverted outputs for enabling production of a pulse up to the full n bit width definable by the associated said digital to analog converter without crossover of said leading edge and trailing edge references.

20. The dual edge pulse width modulation system of claim 19 in which there are two ramps, two sets of leading and trailing edge references, two digital to analog converters, and there are generated alternating sequential pulses.

21. The dual edge pulse width modulation system of claim 19 in which each of said currents associated with each of said digital to analog converters is capable of establishing a voltage level at said outputs equivalent to approximately one half of the full n-bit capacity of said digital to analog converter.

22. The dual edge pulse width modulation system of claim 19 in which said bias current is slightly greater than said operating current to prevent coincidence of said leading and trailing edge references.

23. The dual edge pulse width modulation system of claim 19 in which said control means includes an operating current source and a bias current source associated with each said digital to analog converter.

24. The dual edge pulse width modulation system of claim 23 in which said control means further includes switching means associated with each said digital to analog converter for connecting said bias current source in parallel with said operating current source for enabling provision of a total current up to the full n-bit capacity of said digital to analog converter.

* * * * *